United States Patent
Romero et al.

(10) Patent No.: US 7,279,389 B2
(45) Date of Patent: Oct. 9, 2007

(54) TECHNIQUE FOR FORMING A TRANSISTOR HAVING RAISED DRAIN AND SOURCE REGIONS WITH A TRI-LAYER HARD MASK FOR GATE PATTERNING

(75) Inventors: Karla Romero, Dresden (DE); Thorsten Kammler, Ottendorf-Okrilla (DE); Scott Luning, Dresden (DE); Hans Van Meer, Fishkill, NY (US)

(73) Assignee: Advanced Micro Devices, Inc., Austin, TX (US)

( * ) Notice: Subject to any disclaimer, the term of this patent is extended or adjusted under 35 U.S.C. 154(b) by 42 days.

(21) Appl. No.: 11/280,484

(22) Filed: Nov. 16, 2005

(65) Prior Publication Data

US 2006/0223250 A1 Oct. 5, 2006

(30) Foreign Application Priority Data

Mar. 31, 2005 (DE) ...................... 10 2005 014 749

(51) Int. Cl.
*H01L 21/336* (2006.01)

(52) U.S. Cl. .............................. 438/300; 257/E21.619

(58) Field of Classification Search ................. 438/300
See application file for complete search history.

(56) References Cited

U.S. PATENT DOCUMENTS

| 6,573,030 | B1 * | 6/2003 | Fairbairn et al. ........... 430/323 |
| 6,800,530 | B2 * | 10/2004 | Lee et al. ................... 438/301 |
| 7,037,794 | B2 * | 5/2006 | Beintner et al. ............ 438/300 |
| 7,084,071 | B1 * | 8/2006 | Dakshina-Murthy et al. .... 438/717 |
| 2004/0137672 | A1 | 7/2004 | Lee et al. .................... 438/183 |

FOREIGN PATENT DOCUMENTS

EP 0 517 627 A1 6/1992

* cited by examiner

*Primary Examiner*—W. David Coleman
(74) *Attorney, Agent, or Firm*—Williams, Morgan & Amerson, P.C.

(57) ABSTRACT

By providing a hard mask layer stack including at least three different layers for patterning a gate electrode structure, constraints demanded by sophisticated lithography, as well as cap layer integrity, in a subsequent selective epitaxial growth process may be accomplished, thereby providing the potential for further device scaling of transistor devices requiring raised drain and source regions.

29 Claims, 3 Drawing Sheets

TECHNIQUE FOR FORMING A TRANSISTOR HAVING RAISED DRAIN AND SOURCE REGIONS WITH A TRI-LAYER HARD MASK FOR GATE PATTERNING

BACKGROUND OF THE INVENTION

1. Field of the Invention

The present invention generally relates to the fabrication of integrated circuits, and, more particularly, to the formation of field effect transistors having epitaxially grown raised drain and source regions so as to provide extremely shallow PN junctions.

2. Description of the Related Art

The fabrication of integrated circuits requires the formation of a large number of circuit elements on a given chip area according to a specified circuit layout. Generally, a plurality of process technologies are currently practiced, wherein, for logic circuitry, such as microprocessors, storage chips and the like, CMOS technology is currently the most promising approach, due to the superior characteristics in view of operating speed and/or power consumption and/or cost efficiency. During the fabrication of complex integrated circuits using CMOS technology, millions of complementary transistors, i.e., N-channel transistors and P-channel transistors, are formed on an appropriate substrate.

Typically, a MOS transistor, irrespective of whether an N-channel transistor or a P-channel transistor is considered, comprises so-called PN junctions that are formed at an interface of highly doped drain and source regions with an inversely doped channel region disposed between the drain region and the source region. The conductivity of the channel region is controlled by a gate electrode formed above the channel region and separated therefrom by a thin insulating layer. The conductivity of the channel region depends on the dopant concentration, the mobility of the charge carriers, and, for a given extension of the channel region in the transistor width direction, on the distance between the source and drain regions, which is also referred to as channel length.

Hence, in combination with the capability of rapidly creating a conductive channel below the insulating layer upon application of a specified control voltage to the gate electrode, the conductivity of the channel region substantially determines the characteristics of the MOS transistors. For this reason, the channel length represents a dominant design criterion and a size reduction thereof provides increased operating speed of the integrated circuits. The shrinkage of the transistor dimensions, however, entails a plurality of issues associated therewith which have to be addressed so as to not unduly offset the advantages obtained by steadily decreasing the channel length of MOS transistors.

One problem in this respect is the requirement of extremely shallow PN junctions. That is, the depth of the source and drain regions with respect to an interface formed by the gate insulating layer and the channel region has to be decreased as the channel length is reduced to maintain the required controllability of the conductive channel. The depth of the source and drain regions substantially determines the sheet resistance thereof, which may not be arbitrarily reduced by correspondingly increasing the dopant concentration in the source and drain regions, since an extremely high dopant concentration may give rise to increased leakage currents. Furthermore, the dopants implanted into these regions at very high concentrations may not be completely activated by conventional rapid thermal anneal processes without negatively affecting the overall dopant profile within the source and drain regions. That is, for a desired channel length, defined by the PN junctions, an increased dopant concentration requires higher temperatures and/or a prolonged duration of the corresponding anneal cycles, thereby, however, influencing the dopant profile forming the PN junctions by the inevitable thermal diffusion of the dopants, which finally may lead to a non-acceptable variation of the finally achieved channel length.

In an attempt to further reduce the sheet resistance of the drain and source regions, the conductivity thereof is frequently increased by forming a metal silicide of superior conductivity compared to a highly doped silicon. However, since the penetration depth of the metal silicide is restricted by the depth of the PN junctions, the improvement in conductivity in these regions is therefore coupled to the depth of the corresponding PN junctions. Moreover, in many CMOS technologies, a corresponding metal silicide is simultaneously formed on the gate electrode, wherein a shallow junction depth therefore also creates a very shallow metal silicide in the gate electrode, thereby providing only limited improvement in gaining superior gate electrode conductivity.

In one promising approach, extremely shallow source and drain regions may be formed by raising the source and drain regions above the gate insulation layer/channel region interface and maintaining the drain/source dopant concentration at an acceptable level while providing the possibility of forming highly conductive metal silicide regions without being restricted by the actual depth of the PN junctions due to the increased size of the raised drain and source regions.

Figure 1A:
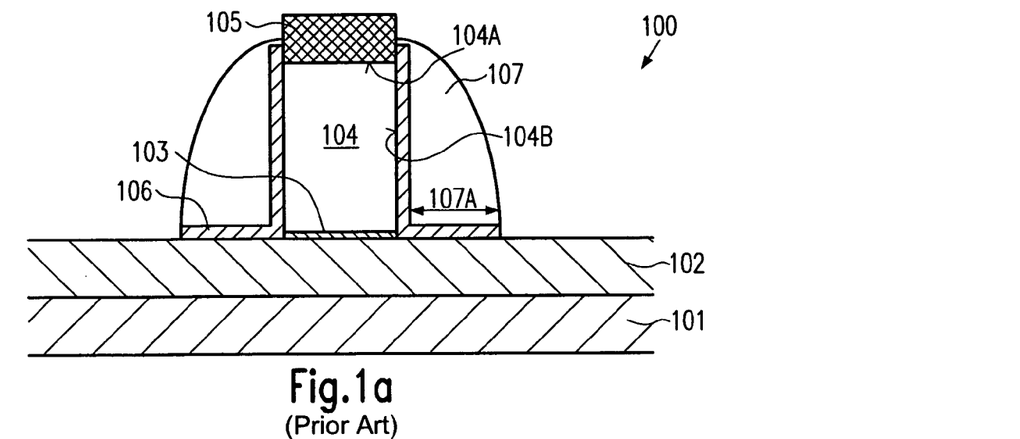
FIGS. 1a-1c schematically show cross-sectional views of a conventional transistor device including raised drain and source regions during various manufacturing stages.
Figure 1B:
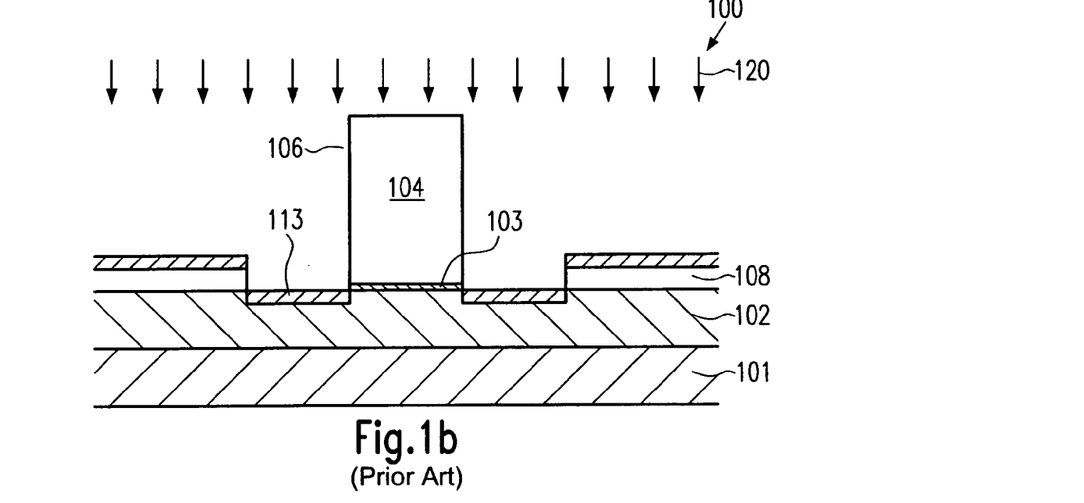
Figure 1C:
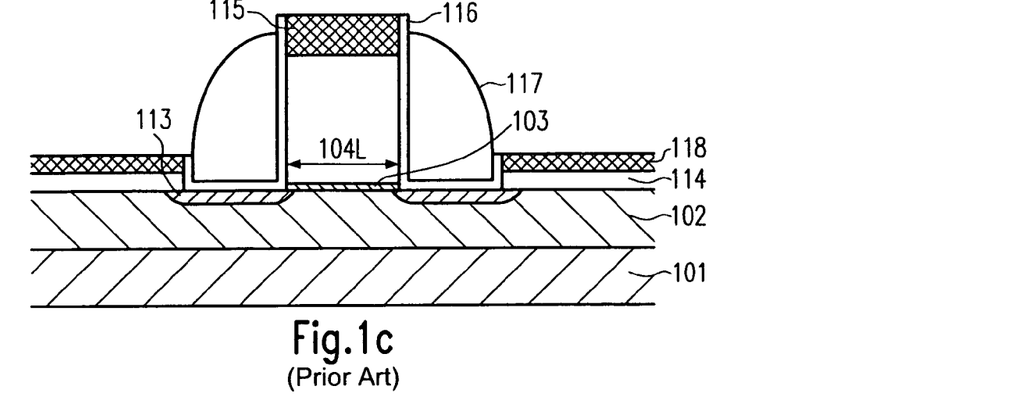

With reference to FIGS. 1a-1c, a typical conventional process flow for forming raised drain and source regions will now be described in more detail. FIG. 1a schematically shows a cross-sectional view of a field effect transistor 100 at an early manufacturing stage. The transistor 100 comprises the substrate 101, for instance a bulk silicon substrate or a silicon-on-insulator (SOI) substrate including a buried insulating layer. Above the substrate 101, a substantially crystalline layer 102 is formed with a thickness that is appropriate for forming PN junctions and a channel region therein. For instance, the transistor 100 may represent an SOI transistor with a thickness of the silicon layer 102 in the range of approximately 20-100 nm.

A gate electrode 104, comprised of polysilicon, is formed above the silicon layer 102 and is separated therefrom by a gate insulation layer 103. The gate insulation layer 103 may be formed in sophisticated devices by a nitrogen-containing silicon dioxide layer with a thickness of approximately 0.6-4 nm. The residue 105 of an anti-reflective coating covers a top surface 104a of the gate electrode 104, while the sidewalls 104b thereof are covered by an oxide liner 106. Moreover, adjacent to the liner 106 are formed sidewall spacer elements 107 comprised of a material, such as silicon nitride, that exhibits a moderately high etch selectivity with respect to the underlying oxide liner 106 so that the spacers 107 may be readily removed after a selective epitaxial growth process.

The transistor 100 as shown in FIG. 1a may be formed in accordance with the following process flow. The substrate 101 may be obtained by a manufacturer of respective substrates in the form of a silicon bulk substrate or in the form of an SOI substrate, wherein the SOI substrate may comprise a crystalline silicon layer as the layer 102 that may be formed in accordance with well-established wafer bonding techniques. Thereafter, an insulating layer is formed having a thickness and a composition that are appropriate for forming the gate insulation layer 103. To this end, sophisticated oxidation and/or deposition techniques may be used as are well established in the art.

Thereafter, a polysilicon layer of appropriate thickness is deposited by low pressure chemical vapor deposition. Next, an anti-reflective coating (ARC), for instance comprised of silicon oxynitride, and a resist layer are deposited and are patterned by sophisticated photolithography to form an etch mask for a subsequent anisotropic etch process for patterning the gate electrode 104 from the deposited polysilicon layer. After patterning the gate electrode 104, the residual ARC layer remains as the layer 105 on the top surface 104*a* of the gate electrode 104.

Thereafter, the gate insulation layer 103 may be patterned and subsequently the oxide liner 106 may be formed by an appropriately designed oxidation process. The sidewall spacers 107 may then be formed by well-established techniques, including the deposition, for instance by plasma enhanced chemical vapor deposition, of a silicon nitride layer of a specified thickness and a subsequent anisotropic etch process, which reliably stops on and in the liner oxide 106, thereby leaving the spacers 107. A width 107*a* of the spacer 107 is readily controllable by appropriately adjusting the thickness of the silicon nitride layer. Hence, a lateral extension of epitaxial growth regions adjacent to the gate electrode 104 is substantially determined by the spacer width 107*a*. Finally, the liner 106 may be removed at exposed portions to provide a substantially crystalline surface of the layer 102 for an epitaxial growth process.

FIG. 1*b* schematically shows the device 100 with selectively grown silicon regions 108 above the silicon layer 102, wherein a lateral distance of the regions 108 from the gate electrode 104 substantially corresponds to the spacer width 107*a* (see FIG. 1*a*) plus the minimal thickness of the liner oxide 106. Moreover, the spacers 107, the liner 106 and the residual ARC layer 105 are removed. The process for forming the crystalline regions 108, which may contain a specified dopant material, typically involves a selective epitaxial growth technique. This growth technique of a semiconductor material is a deposition technique in which the deposited material layer forms a crystalline structure in conformity with the crystalline structure of the underlying material, acting as a template, as long as the deposited material is able to form a lattice that is sufficiently similar in structure and lattice spacing to the lattice of the underlying material. Furthermore, the deposition parameters are selected in such a manner that the semiconductor material adheres mainly to the atoms of the ordered crystalline surface of the layer 102 rather than to the dielectric non-crystalline surfaces of the spacers 107 and the residual ARC layer 105. Thereafter, the spacers 107, the liner 106 and the layer 105 are removed by well-established highly selective etch processes. Subsequently the device 100 may be subjected to an ion implantation sequence 120 including, for instance, a halo and extension implantation to form extension regions 113 in the layer 102 and also form implantation regions 113 in the regions 108. Following the implantation 120, an anneal process may be performed, thereby activating dopants and substantially re-crystallizing implantation-induced damage in the layer 102 and the regions 108.

FIG. 1*c* schematically shows the device 100 in a further advanced manufacturing stage. Here, the device 100 comprises a spacer 117 formed on a liner 116. The spacer 117 may be comprised of silicon nitride, while the liner 116 may be made of silicon dioxide. Moreover, metal silicide regions 118 are formed in the epitaxially grown regions 108 and form in combination source and drain regions 114. A further metal silicide region 115 is formed in the gate electrode 104. Typically, the spacer 117 and the liner 116 may be formed substantially in the same way as is previously described with respect to the spacer 107 and the liner 106. The silicide regions 115 and 118 may be formed commonly or separately in accordance with well-established silicidation regimes, wherein the spacer 117 prevents an undesired creation of a conductive path between the gate electrode 104 and the drain and source regions 114 during the formation of the metal silicide regions 115 and 118.

As a result, the above-described process flow enables the formation of required shallow PN junctions in the form of the extensions 113, while nevertheless providing a low contact resistance to the drain and source regions 114 by providing the additional selectively grown silicon regions 108, which may be used to receive a highly conductive metal silicide, wherein the silicidation process does not adversely affect the extensions 113, nor is the silicidation process restricted by the depth of the extensions 113 and the drain and source regions 114.

Although the process flow described above provides significant improvements in forming raised drain and source regions, in highly sophisticated applications requiring critical dimensions, i.e., a gate length 104*l* of the gate electrode 104 of approximately 50 nm and even less, the approach with removable spacers, i.e., the spacers 107, and with a reliable coverage of the gate electrode, renders it increasingly difficult to also appropriately pattern the gate electrode 104 by means of the residual ARC layer 105. In other words, since the residual ARC layer 105 is important for both the patterning of the gate electrode 104 and the reliable coverage thereof in the subsequent selective epitaxial growth process, the conventional ARC layer 105 may not suffice, as its integrity may suffer during the patterning process for the gate electrode 104 owing to, for instance, a resist mask of reduced thickness and other requirements as may be necessary in the advanced 193 nm lithography. Consequently, the coverage of the top surface 104*a* with an ARC layer meeting the strict requirements of the preceding lithography, resist trim and gate etch processes designed for highly scaled devices may not be reliably guaranteed.

In view of the above situation, a need therefore exists for an improved technique that enables the formation of raised source and drain regions by selective epitaxial growth while still offering the potential for device scaling.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present invention is directed to a technique that enables the formation of advanced transistor devices requiring raised drain and source regions formed by a selective epitaxial growth technique, wherein, at the same time, the patterning process for forming the gate electrode structure may be performed with high pattern fidelity even for highly scaled devices, while, after the patterning process, a reliable coverage of the top surface of the gate electrode structure is obtained. For this purpose, a hard mask layer is provided for patterning the gate electrode structure, wherein the hard mask layer may comprise a specified layer designed to substantially remain intact after the patterning process.

According to one illustrative embodiment of the present invention, a method comprises forming a layer of gate electrode material above a semiconductor region and forming a hard mask layer stack on the layer of gate electrode material, wherein the hard mask layer stack comprises a first layer next to the layer of gate electrode material, a second layer next to the first layer and a third layer next to the second layer. Furthermore, the hard mask layer stack is patterned to form an etch mask and the layer of gate electrode material is patterned by means of the hard mask to thereby form a gate electrode. Finally, a semiconductor material is selectively epitaxially grown on the semiconductor region, while a top surface of the gate electrode is covered by the first layer.

According to another illustrative embodiment of the present invention, a method comprises determining in advance a first target thickness, a second target thickness and a third target thickness for a first layer, a second layer and a third layer, respectively, of a mask layer stack. Additionally, a layer of gate electrode material is formed above a semiconductor region formed in a plurality of substrates and the hard mask layer stack is formed on the layer of gate electrode material formed on the plurality of substrates. Moreover, on each of the plurality of substrates, the layer of gate electrode material is patterned by means of the hard mask to form a gate electrode. Finally, a semiconductor material is selectively epitaxially grown on the semiconductor region of each of the plurality of substrates, while a top surface of the gate electrode is covered by the first layer.

BRIEF DESCRIPTION OF THE DRAWINGS

The invention may be understood by reference to the following description taken in conjunction with the accompanying drawings, in which like reference numerals identify like elements, and in which.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present invention generally provides a technique that enables the formation of gate electrode structures of highly advanced semiconductor devices having a critical dimension of approximately 50 nm and even less, while at the same time a reliable coverage of the gate electrode structure during a selective epitaxial growth process on the basis of removable spacers is achieved. For the formation of gate electrode structures having critical dimensions of 50 nm and less as is required for the 90 nm technology, the 65 nm technology and the like, it is of great importance to accurately control the photolithography so as to obtain highly accurate resist features with a deviation of desirably less than 1 nm. Typically, the formation of resist features requires sophisticated resist trim processes during which the resist feature immediately obtained after the development of the exposed photoresist are shrunk to the finally desired dimension. In order to obtain highly accurate initial resist features, sophisticated lithography techniques on the basis of short exposure wavelengths, such as 193 nm and less, may have to be used, which in turn require precise control of initial resist thickness, back reflectivity into the resist and the like. Hence, the resist thickness for advanced lithography processes may not suffice to act as an etch mask for patterning the gate electrode material, especially after the resist trim process. Therefore, typically, a hard mask may be formed on the basis of the trimmed resist feature so that the actual etch process for patterning the gate electrode material is performed on the basis of the hard mask. Since precise control of the lithography process is required for highly advanced devices, the hard mask may also have to provide excellent anti-reflective characteristics and act as a precise anti-reflective coating to enable the formation of a precise initial resist feature. Moreover, as the hard mask may also be consumed during the anisotropic etch process for patterning the gate material, a reliable coverage of the gate material after patterning may conventionally not be sufficient to reliably cover a top surface of the gate electrode during an epitaxial growth process as is typically performed in conventional process flows. Consequently, the present invention provides a hard mask layer stack that is designed to provide excellent optical characteristics to serve as an anti-reflective coating, provide sufficient etch selectivity to the gate electrode material and maintain a precisely defined residual layer so as to reliably cover the gate electrode during a subsequent epitaxial growth process.

Figure 2A:
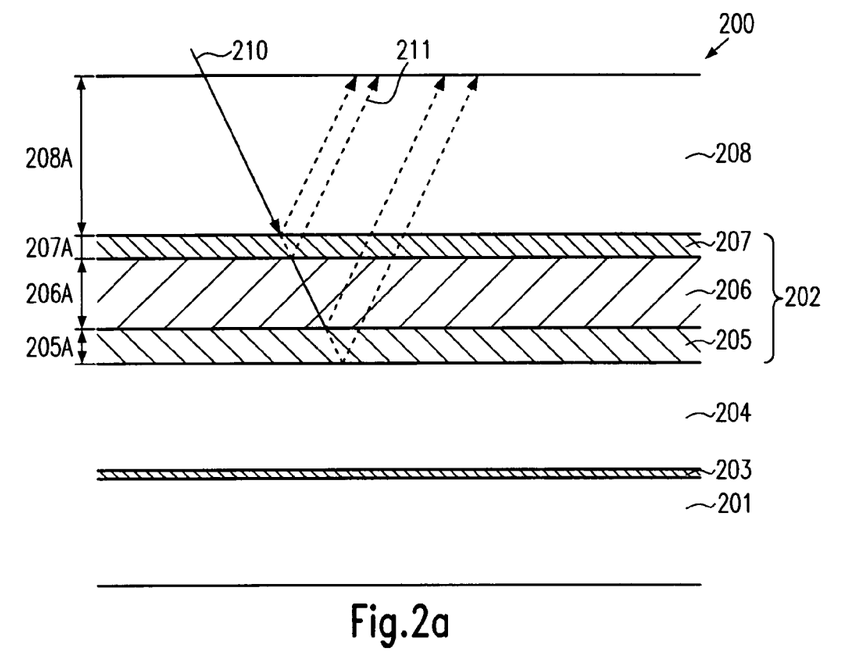
FIGS. 2a-2e schematically show cross-sectional views of a semiconductor device during the patterning of a gate electrode and the growth of raised source and drain regions according to illustrative embodiments of the present invention.

With reference to FIGS. 2a-2e, further illustrative embodiments of the present invention will now be described in more detail. FIG. 2a schematically shows a cross-sectional view of a semiconductor device 200 in a process for patterning a gate electrode structure with reliable coverage of the gate electrode structure after the patterning process. The semiconductor device 200 may represent an advanced transistor element having a critical dimension, i.e., a gate length, of approximately 50 nm or even less so that any lithography technique involved may be performed on the basis of 193 nm or an even shorter exposure wavelength, while it should be appreciated that in principle the present invention may also be practiced in conjunction with longer exposure wavelengths, such as 248 nm.

The semiconductor device 200 comprises a semiconductor region 201, which may be provided in the form of a bulk substrate having formed thereon an appropriately designed crystalline semiconductor layer, such as an epitaxially grown semiconductor layer, while, in other embodiments, the semiconductor region 201 may be a part of an SOI substrate, as is, for instance, described with reference to FIG. 1a. In particular embodiments, the semiconductor region 201 may be substantially comprised of silicon, while, in other embodiments, depending on device and process requirements, other semiconductor materials, such as silicon/germanium, germanium and any appropriate III-V or II-VI semiconductor materials, may be used. Moreover, the semiconductor region 201 may represent a region having different crystalline orientations and/or intrinsic strain, wherein a corresponding intrinsic strain may also be created during the further processing of the device 200.

A layer 204 of gate electrode material, such as polysilicon, doped polysilicon and the like, is formed above the semiconductor region 201 with a gate insulation layer 203 in between that electrically insulates the layer 204 and the region 201. A mask layer stack 202 is formed on the layer 204 of the gate electrode material, wherein the mask layer stack 202 comprises, in one particular embodiment, at least three layers of different materials. A first layer 205 is formed next to the layer 204 of gate electrode material and is comprised of a material appropriate to act as a growth mask during a subsequent selective epitaxial growth process.

In one particular embodiment, the first layer 205 may comprise silicon and nitrogen, for instance as silicon nitride. In other embodiments, the first layer 205 may be comprised of silicon oxynitride so as to enable a precise adaptation of optical characteristics of the first layer, when the optical behavior of the first layer 205 is relevant in adjusting the overall anti-reflective characteristics of the mask layer stack 202. In other words, when a specified optical behavior, that is, a specified index of refraction, is required for a given target thickness 205a of the layer 205, the optical characteristic may be adjusted by correspondingly selecting the ratio between nitrogen and oxygen in the layer 205.

The mask layer stack 202 may further comprise a second layer 206 located next to the first layer 205 and having a second target thickness 206a that is selected with respect to the material composition of the layer 206 to provide sufficient protection during a subsequent anisotropic etch process for patterning the first layer 205 and the layer 204 of gate electrode material. Moreover, the second layer 206 may further be designed to act as an efficient ARC layer in combination with a third cap layer 207 formed on the second layer 206. In one illustrative embodiment, the second layer 206 may substantially be comprised of amorphous carbon. The third layer or cap layer 207 located next to the second layer 206 may be comprised of any appropriate material that provides, in combination with the second layer 206 and possibly in combination with the first layer 205, the required low reflectivity for a specified exposure wavelength and also substantially prevents the second layer 206 from directly contacting a resist layer to be formed on the mask layer stack 202. For instance, the cap layer 207 may be comprised of silicon dioxide, silicon oxynitride, other nitrogen-free dielectric layers and the like. In particular embodiments, the cap layer 207 may be comprised of a nitrogen-free material, such as silicon dioxide, to also prevent resist poisoning caused by nitrogen and nitrogen radicals that may otherwise be present during the formation of a resist layer and its exposure. A target thickness 207a of the cap layer 207 is, on the basis of the material composition of the layer 207, selected to act in combination with at least the second layer 206 as an effective ARC layer for the specified exposure wavelength. As previously mentioned, the reflectivity of an anti-reflective coating during the patterning of the layer 204 of gate electrode material may significantly affect the accuracy of a resist trim process for forming a resist feature from a resist layer 208 formed above the mask layer stack 202. Since the mask layer stack 202, that is, mainly the second layer 206, may act as an etch mask for patterning the layer 204, a target thickness 208a of the resist layer 208 may be selected sufficiently thin, that is, approximately 100-300 nm for an exposure wavelength of 193 nm, to provide the required optical behavior while at the same time providing sufficient protection for reliably patterning the layers 207 and 206, even after a further shrinkage of the layer thickness 208a, as will be described in more detail with reference to FIG. 2b.

For instance, for a gate length of 50 nm or less, a deviation of less than 1 nm may be required to meet the device specifications. Additionally, a coverage of a gate electrode formed from the layer 204 has to be reliably maintained in an epitaxial growth process. Hence, the first layer 205 or at least a significant portion thereof has to remain after the anisotropic etch process. Consequently, in illustrative embodiments, the first target thickness 205a may be determined on process requirements regarding the selective epitaxial growth process and any pre-deposition processes, such as cleaning processes, spacer formation processes and the like, so as to obtain the target thickness 205a such that a reliable coverage even at corner areas of the gate electrode structure to be formed is obtained. An appropriate value for the target thickness 205a may be obtained on the basis of test and process data wherein, for instance, test data may be gathered by forming a plurality of layers 205 of different thickness and performing a process sequence identical or similar to the actual process conditions of any pre-deposition processes and the epitaxial growth process. Based on these measurement data, an appropriate target thickness 205a for a specified material composition of the layer 205 may be determined. For instance, when the first layer 205 is comprised of silicon nitride, an appropriate value for the target thickness 205a may be in the range of approximately 20-50 nm.

Once the target thickness 205a is fixed, the second target thickness 206a may be determined, wherein, for a specified etch recipe, the etch selectivity with respect to the layer 204 of gate electrode material and with respect to the first layer 205 may be taken into consideration. It should be appreciated that, in some embodiments, different etch chemistries may be used in a subsequent etch process for etching through the first layer 205 and through the layer 204 of gate electrode material. For instance, when the second layer 206 is substantially comprised of amorphous carbon, an etch selectivity on the basis of well-established etch recipes may be approximately 1:10 or less so that the target thickness 206a may be selected to be approximately 30-50% of the thickness of the layer 204 to provide a sufficient safety margin. Additionally, the target thickness 206a has also to take into consideration the target thickness 205a for etching through the layer 205 with a corresponding etch recipe. In one illustrative embodiment, the target thickness 206a for the layer 206, when comprised of amorphous carbon, with the layer 205 comprised of silicon nitride, may be selected to be approximately 50 nm or more, when the layer 204 has a thickness of approximately 80-100 nm. The second target thickness 206a may be estimated on the basis of test runs, in which a stack corresponding to the mask layer stack 202 including the polysilicon layer 204 and the first layer 205 having the desired target thickness 205a is patterned in accordance with one or more specified process recipes, wherein different thicknesses for the layer 206 may be provided, or wherein the residual thickness of the layer 205 may be determined so as to estimate an appropriate value for the target thickness 206a.

Once the second target thickness 206a is determined, an appropriate value for the target thickness 207a may be determined, thereby taking into consideration the material composition of the layer 206, that is, the optical characteristics thereof, possibly the optical characteristics of the layer 205, the corresponding target thicknesses 206a and 205a, and the material composition of the layer 207. In determining the target thickness 207a, simulation calculations may be performed on the basis of an incoming light beam 210 having the specified exposure wavelength, such as 193 nm, and an intensity of back scattered beams 211 may be determined, which may be reflected on the various interfaces formed by the stack 202 and the overlying resist layer 208. Moreover, in determining the target thickness 207a, other constraints may be taken into consideration, such as requirements with regard to the etch recipe and step coverage constraints in forming the layer stack 202, since a certain pronounced topography may be created during preceding processes, such as trench isolation structure and the like. Consequently, the target thickness 207a may be determined to have a minimum value to meet the etch and step coverage constraints, whereas an appropriate value greater than the desired minimum value is then obtained on the basis of the simulation calculations, thereby reducing the intensity of the reflected beams 211 below a predefined range, such as approximately 1.5% or less. For instance, when the layer 206 is provided as an amorphous carbon layer having the target thickness 206a as specified above, and the layer 207 is comprised of silicon dioxide, an appropriate value for the target thickness 207a may be approximately 50 nm or more.

Similarly, the thickness 208a of the resist layer 208 may be determined, wherein substantially optical issues are to be taken into consideration, since the height 208a, even with its reduced value after a trim etch process, may be sufficient to at least pattern the layers 207 and 206 with a high pattern fidelity.

Once appropriate values for the target thicknesses of the layers that comprise the layer stack 202 and the resist layer 208 are established, the device 200 as shown in FIG. 2a may be formed in accordance with the following processes. After the formation of the gate insulation layer 203 by well-established oxidation and/or deposition recipes, the layer 204 may be formed, for instance, on the basis of polysilicon by well-established low pressure chemical vapor deposition (LPCVD) techniques. Thereafter, the layer 205 may be formed by chemical vapor deposition techniques, such as LPCVD or plasma enhanced chemical vapor deposition (PECVD). In some embodiments, the layer 205 may be formed by LPCVD or PECVD so as to form a silicon nitride layer or a silicon oxynitride layer. Thereafter, the second layer 206 may be formed in one particular embodiment as an amorphous carbon layer by means of well-established PECVD techniques. Next, the third layer 207 may be formed by any appropriate deposition technique. In some illustrative embodiments, the layer 207 may be provided in the form of a silicon dioxide layer, wherein the silicon dioxide may be deposited on the basis of TEOS (tetra-ethyl-ortho-silicate) to create a substantially nitrogen-free cap layer having well-understood mechanical and optical characteristics.

In one embodiment, the deposition of the layer 206, when provided as an amorphous carbon layer, and the layer 207, when provided as silicon dioxide, may be performed in the same deposition tool. Moreover, in some embodiments, a gaseous ambient containing helium and oxygen may be provided while relatively low substrate temperatures of less than 370° C. may be established so that a moderately low deposition rate is obtained, thereby providing superior control of the silicon dioxide target thickness 207a. After the formation of the mask layer stack 202 on the basis of the previously determined target thicknesses 205a, 206a and 207a, the resist layer 208 is formed on the basis of well-approved spin-on techniques. Thereafter, an advanced photolithography process is performed to expose the resist layer 208 to the specified exposure wavelength and to remove non-exposed portions of the resist layer 208.

Figure 2B:
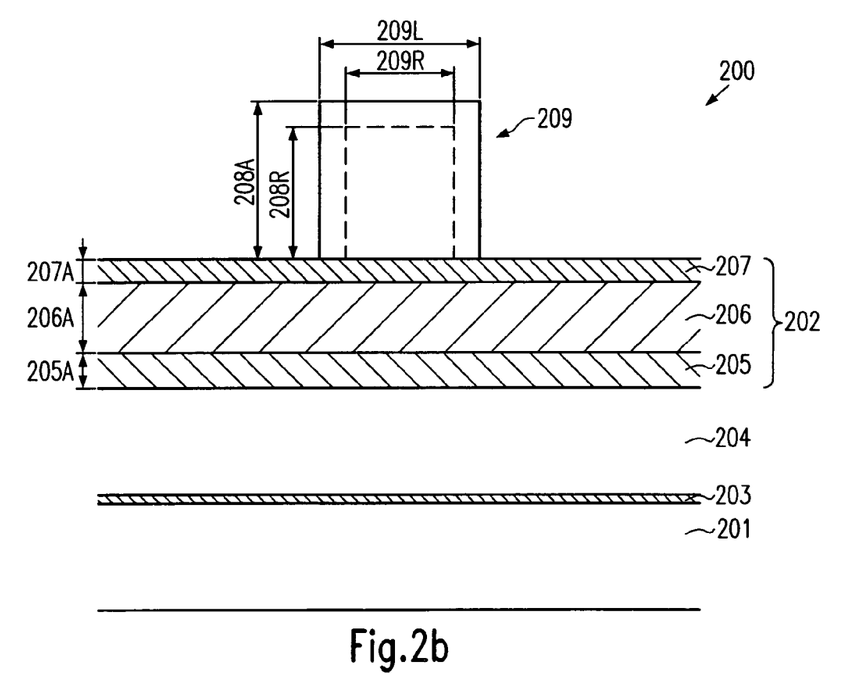

FIG. 2b schematically shows the device 200 after the above described photolithography process to form a resist feature 209 having a lateral dimension 209l and a height that substantially corresponds to the thickness 208a. Thereafter, a resist trim etch process is performed to reduce the feature length 209l to a desired target gate length 209r, wherein, also during this process, the initial height 208a may be reduced to a height 208r. On the basis of the resist feature 209 having the reduced dimensions 209r and 208r, an anisotropic etch process on the basis of well-established process recipes is performed to pattern at least a portion of the mask layer stack 202 for forming a hard mask for a subsequent patterning process for the layer 204. In one illustrative embodiment, the anisotropic etch process may be designed to substantially pattern the layers 207 and 206 while using the layer 205 as an etch stop layer. In other embodiments, the layer 205 may also be etched to a certain degree, depending on the initial height 208r of the reduced resist feature 209.

Figure 2C:
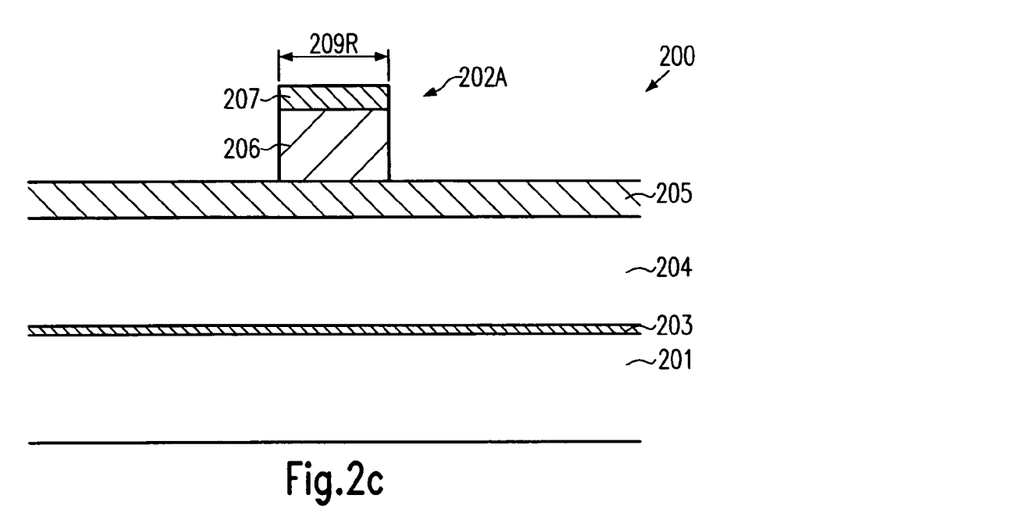

FIG. 2c schematically shows the device 200 after completion of the anisotropic etch process for at least partially patterning the mask layer stack 202 to obtain a hard mask 202a. In the embodiment shown, the layer 205 is substantially maintained and will be patterned during a subsequent etch process on the basis of the hard mask 202a. Moreover, the hard mask 202a has substantially the same dimensions as the reduced resist feature 209 and thus exhibits a length 209r.

Figure 2D:
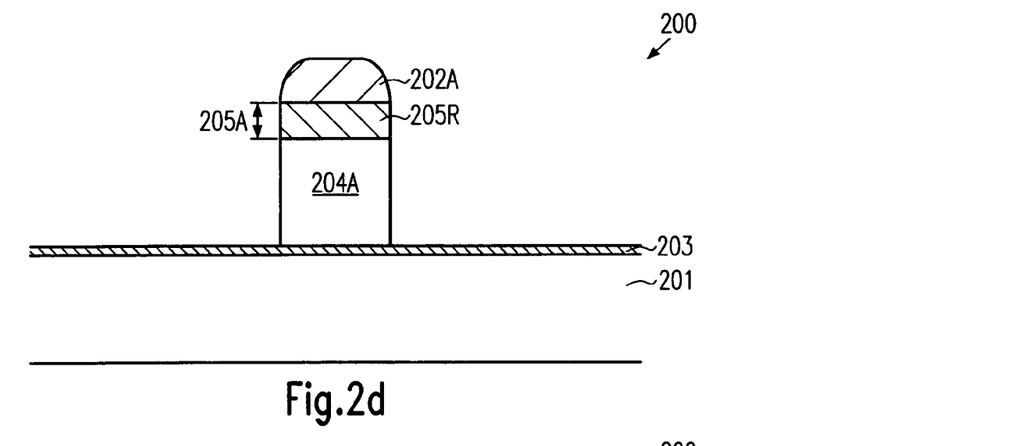

FIG. 2d schematically shows the device 200 in a further advanced manufacturing stage. Here, the device 200 is shown after the completion of a further anisotropic etch process to etch through the layers 205 and 204 to form a gate electrode 204a. Moreover, due to the adaptation of the target thickness 206a (see FIGS. 2a and 2b), the hard mask 202a is not entirely consumed during the anisotropic etch process, thereby substantially preserving the layer 205, which is now denoted as 205r, over the gate electrode 204a. Consequently, the layer 205r is maintained with the target thickness 205a substantially without compromising the integrity of the layer 205r even at corner portions of the gate electrode 204a, thereby providing a reliable protection of the gate electrode 204a in subsequent process steps. It should be appreciated that the anisotropic etch process for etching through the layers 205 and 204 may be performed on well-established process recipes, wherein, in some embodiments, different etch chemistry may be used for etching through the layer 205 and the layer 204. Thereafter, the residue of the hard mask 202a and exposed portions of the gate insulation layer 203 may be removed by any appropriate etch processes, as are well-known in the art. Thereafter, a spacer formation process sequence may be performed to cover sidewalls of the gate electrode 204a by sidewall spacers, as is described for instance with reference to FIG. 1a. That is, a liner material may be deposited followed by a spacer material and this layer stack may subsequently be anisotropically etched to form sidewall spacers. Thereafter, portions of the semiconductor region 201 not covered by the sidewall spacers may be exposed and cleaned and thus prepared for a subsequent selective epitaxial growth process.

Figure 2E:
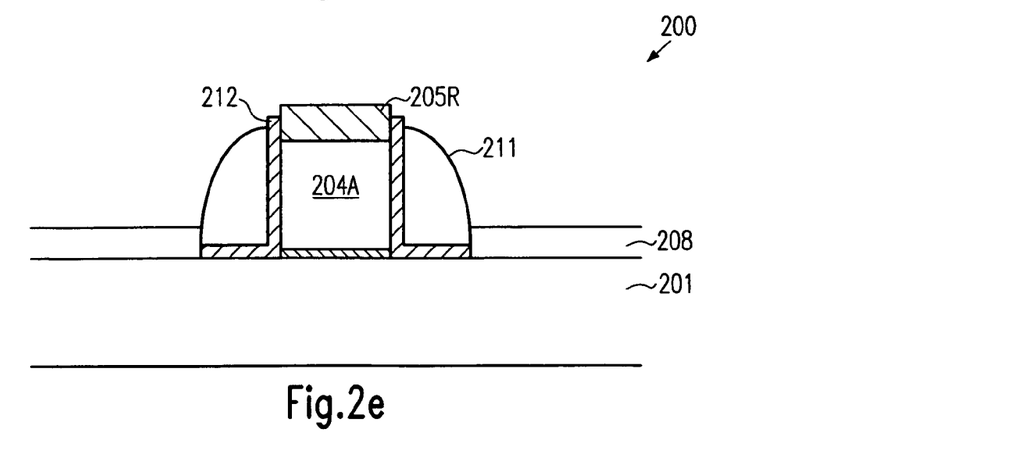

FIG. 2e schematically shows the device 200 after completion of the above-described process sequence. Thus, the device 200 comprises disposable sidewall spacers 211, for instance comprised of silicon nitride, silicon dioxide and the like, formed on respective liners 212, formed of silicon dioxide, silicon nitride and the like, thereby completely covering the sidewalls of the gate electrode 204a. Moreover, epitaxially grown semiconductor regions 208 are formed above the semiconductor region 201, wherein the semiconductor material 208 may be similar in its crystalline structure to the "template" material 201 so as to obtain a high crystalline quality in the regions 208. Moreover, the regions 208 may be doped during the selective epitaxial growth process so as to deposit a desired dopant concentration within the regions 208, which will be formed to drain and source regions in subsequent process steps, as is also described with respect to FIG. 1d. It should further be appreciated that the spacers 211 may be removed to form appropriate extension regions as is also described with reference to FIG. 1c. In other embodiments, appropriate implantation or diffusion processes may have been performed prior to the formation of the spacers 211, thereby forming corresponding extension regions (not shown). In this case, the spacers 211 may also be used for forming appropriate silicide regions in the gate electrode 204a and the semiconductor regions 208. For instance, prior to the corresponding silicidation process, the cap layer 205r may be removed by a highly selective etch process, thereby also reducing the size of the spacers 211 and thereafter a refractory metal may be deposited to initiate a silicidation process on exposed surfaces of the gate electrode 204a and the regions 208.

As a result, the present invention provides a technique that enables the patterning of gate electrode structures of highly scaled transistor devices, wherein an enhanced mask layer stack is used for providing superior optical characteristics during the exposure of a resist layer, while at the same time a specified portion of the mask layer stack remains during a subsequent patterning process to reliably cover the resulting gate electrode structure. In a particular embodiment, the mask layer stack is provided in the form of a three layer stack, in which the first layer next to the gate electrode material is substantially maintained, while the remaining layers are used as effective ARC layers and hard mask for patterning the first layer and the gate electrode material. Consequently, advanced lithography techniques involving short exposure wavelengths such as 193 nm, may efficiently be used in patterning the gate electrode structure, while at the same time a high degree of process reliability in a subsequent selective epitaxial growth process is provided due to the high degree of integrity that results from the provision of an additional cap layer within the hard mask layer stack.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method, comprising:
forming a layer of gate electrode material above a semiconductor region;
forming a hard mask layer stack on said layer of gate electrode material, said hard mask layer stack comprising a first layer next to said layer of gate electrode material, a second layer next to said first layer and a third layer next to said second layer, wherein said second layer is comprised of amorphous carbon;
patterning said hard mask layer stack to form an etch mask comprised of at least said first layer;
patterning said layer of gate electrode material by means of said etch mask to form a gate electrode; and
selectively epitaxially growing a semiconductor material on said semiconductor region while a top surface of said gate electrode is covered by at least said first layer.

2. The method of claim 1, further comprising forming a sidewall spacer on the sidewalls of said gate electrode prior to selectively epitaxially growing a semiconductor material.

3. The method of claim 1, wherein said first layer comprises silicon and nitrogen.

4. The method of claim 1, wherein said third layer comprises silicon and oxygen.

5. The method of claim 4, wherein said third layer is substantially free of nitrogen.

6. The method of claim 1, wherein said hard mask layer stack comprises not more than three layers of different materials.

7. The method of claim 1, further comprising determining in advance a first target thickness of said first layer so as to provide a desired degree of protection during said selective epitaxial growth process and adapting a second target thickness of at least said second layer on the basis of said first target thickness.

8. The method of claim 7, wherein patterning said mask layer stack comprises patterning said second and said third layers with a resist mask and patterning said first layer using at least said second layer having said second target thickness.

9. The method of claim 8, wherein said layer of gate electrode material is patterned using said second layer as an etch mask, said second target thickness being selected so as to substantially avoid exposure of said first layer of said mask layer stack.

10. The method of claim 7, further comprising determining a third target thickness of said third layer on the basis of said second target thickness, an optical characteristic of said second layer and an optical characteristic of said third layer.

11. The method of claim 10, wherein said third target thickness is determined so as to maintain a reflectivity defined for a specified exposure wavelength below a predefined target value.

12. The method of claim 11, wherein said third target thickness is approximately 15 nm or more.

13. The method of claim 7, wherein said second target thickness is approximately 40 nm or more.

14. The method of claim 7, wherein said first target thickness is approximately 20 nm or more.

15. A method, comprising:
   determining in advance a first target thickness, a second target thickness and a third target thickness for a first layer, a second layer and a third layer, respectively, of a hard mask layer stack, wherein said third layer comprises silicon and oxygen;
   forming a layer of gate electrode material above a semiconductor region of a substrate;
   forming said hard mask layer stack on said layer of gate electrode material formed on said substrate;
   patterning said layer of gate electrode material by means of said hard mask layer stack to form a gate electrode; and
   selectively epitaxially growing a semiconductor material on said semiconductor region of said substrate while a top surface of said gate electrode is covered by said first layer.

16. The method of claim 15, further comprising forming a sidewall spacer on the sidewalls of said gate electrode prior to selectively epitaxially growing a semiconductor material.

17. The method of claim 15, wherein said first layer comprises silicon and nitrogen.

18. The method of claim 15, wherein said second layer is comprised of amorphous carbon.

19. The method of claim 15, wherein said third layer is substantially free of nitrogen.

20. The method of claim 15, wherein said hard mask layer stack comprises not more than three layers of different materials.

21. The method of claim 15, wherein patterning said hard mask layer stack comprises patterning said second and said third layers with a resist mask and patterning said first layer using at least said second layer having said second target thickness.

22. The method of claim 21, wherein said layer of gate electrode material is patterned using said second layer as an etch mask, said second target thickness being selected so as to substantially avoid exposure of said first layer of said mask layer stack.

23. The method of claim 15, wherein said third target thickness is determined so as to maintain a reflectivity defined for a specified exposure wavelength below a predefined target value.

24. The method of claim 23, wherein said third target thickness is approximately 15 nm or more.

25. The method of claim 15, wherein said second target thickness is approximately 40 nm or more.

26. The method of claim 15, wherein said first target thickness is approximately 20 nm or more.

27. A method, comprising:
   forming a layer of gate electrode material above a semiconductor region;
   forming a hard mask layer stack on said layer of gate electrode material, said hard mask layer stack comprising a first layer next to said layer of gate electrode material, a second layer next to said first layer and a third layer next to said second layer, wherein said third layer comprises silicon and oxygen;
   patterning said hard mask layer stack to form an etch mask comprised of at least said first layer;
   patterning said layer of gate electrode material by means of said etch mask to form a gate electrode; and
   selectively epitaxially growing a semiconductor material on said semiconductor region while a top surface of said gate electrode is covered by at least said first layer.

28. The method of claim 27, wherein said third layer is substantially free of nitrogen.

29. A method, comprising:
   determining in advance a first target thickness, a second target thickness and a third target thickness for a first layer, a second layer and a third layer, respectively, of a hard mask layer stack, wherein said second layer is comprised of amorphous carbon.;
   forming a layer of gate electrode material above a semiconductor region of a substrate;
   forming said hard mask layer stack on said layer of gate electrode material formed on said substrate;
   patterning said layer of gate electrode material by means of said hard mask layer stack to form a gate electrode; and
   selectively epitaxially growing a semiconductor material on said semiconductor region of said substrate while a top surface of said gate electrode is covered by said first layer.

* * * * *